(12) United States Patent
Panday et al.

(10) Patent No.: US 6,828,635 B2
(45) Date of Patent: Dec. 7, 2004

(54) METHOD FOR MAKING HIGH-GAIN VERTICAL BIPOLAR JUNCTION TRANSISTOR STRUCTURES COMPATIBLE WITH CMOS PROCESS

(75) Inventors: Shesh Mani Panday, Singapore (SG); Alan Shafi, Papworth Eugrard (GB); Yong Ju, San Jose, CA (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/655,475

(22) Filed: Sep. 4, 2003

(65) Prior Publication Data

US 2004/0051147 A1 Mar. 18, 2004

Related U.S. Application Data

(62) Division of application No. 10/246,228, filed on Sep. 18, 2002, now Pat. No. 6,630,377.

(51) Int. Cl.[7] ............................................. H01L 29/76
(52) U.S. Cl. ....................................... 257/370; 257/552
(58) Field of Search ................................ 257/370, 378, 257/552, 577, 593

(56) References Cited

U.S. PATENT DOCUMENTS

| | | | |
|---|---|---|---|
| 5,672,897 A | * 9/1997 | Watanabe et al. | 257/370 |
| 5,929,506 A | * 7/1999 | Hutter et al. | 257/552 |
| 6,030,864 A | 2/2000 | Appel et al. | 438/234 |
| 6,130,117 A | 10/2000 | Walker et al. | 438/133 |
| 6,174,760 B1 | 1/2001 | Cheng et al. | 438/202 |
| 6,441,441 B1 | * 8/2002 | Suda | 257/370 |
| 6,649,983 B2 | * 11/2003 | Chatterjee | 257/370 |

\* cited by examiner

Primary Examiner—Chandra Chaudhari
(74) Attorney, Agent, or Firm—George O. Saile; Rosemary L. S. Pike

(57) ABSTRACT

An improved NPN bipolar transistor integratable with CMOS FET processing is achieved. The transistor is formed on a substrate using a CMOS process and one additional masking and implant step. The CMOS N wells are used to form the collector contacts (reachthrough) and the P wells are used to form the base. N doped third wells are formed under the N wells, P wells, and shallow trench isolation regions to provide subcollectors. Since the P wells are not implanted through the STI, basewidths are reduced and current gain is increased. Gate electrode masking elements, formed over the base, separate the emitter and base contact regions, improving the emitter-to-base breakdown voltage. The CMOS source/drain N type implants then form emitters in the emitter regions and ohmic contacts in the collector contacts. The source/drain P type implants form the ohmic base contacts to complete the bipolar transistor.

6 Claims, 10 Drawing Sheets

METHOD FOR MAKING HIGH-GAIN VERTICAL BIPOLAR JUNCTION TRANSISTOR STRUCTURES COMPATIBLE WITH CMOS PROCESS

This a division of patent application Ser. No. 10/246,228, filing date Sep. 18, 2002, now U.S. Pat. No. 6,630,377, Method For Making High-Gain Vertical Bipolar Junction Transistor Structures Compatible With Cmos Process, assigned to the same assignee as the present invention.

BACKGROUND OF THE INVENTION (1) Field of the Invention

The present invention relates to the fabrication of integrated circuit devices on semiconductor substrates, and more particularly relates to a method for making bipolar junction transistors (BJTs, hereafter also referred to as bipolar transistors) that are compatible with CMOS processes. The improved bipolar transistor results in increased current gain of the BJT while requiring only one additional implant mask.

(2) Description of the Prior Art 2

Typically the fabrication of bipolar and CMOS transistors on the same chip requires a considerable number of additional processing steps. Because of their vertical structure, bipolar transistors require a series of separate implant masks and ion implant steps for making the emitter, base, and collector. This is because the bipolar requires multiple masking and implant steps to form the collector, base, and emitter at different depths in the silicon substrate. On the other hand, the field effect transistors (FETs), such as used on dynamic random access memory (DRAM) circuits, are basically surface devices that are simpler to fabricate. However, for many circuit applications, it is desirable to be able to fabricate the bipolar transistors and FETs, commonly referred to as BiCMOS devices, on the same substrate with reduced complexity.

One problem in integrating bipolar transistors with CMOS devices is the low current gain (Ic/Ib about 25) of the bipolar transistor. To achieve high current gains (Beta) it is desirable to form the base as narrow as possible to reduce the electron-hole recombination in the base. One conventional type of bipolar transistor is shown in FIG. 1. In this approach a buried $N^+$ region 12 is formed in a substrate 10 to form the transistor collector, and an $N^-$ doped epitaxial layer 14 is grown. Next, shallow trench isolation (STI) 16 is used to electrically isolate the device areas. Then the base 18 is implanted through the STI 16, and the STI is used to separate the base contact 18B from the implanted emitter region 20 to improve (increase) the emitter-to-base breakdown voltage. Unfortunately, the need to implant the base 18 through the STI 16 limits how thin the base can be made because it is necessary to implant through the STI to provide electrical continuity between the intrinsic base region 18 and the extrinsic base contact 18B.

The low current gain (Beta) (Ic/Ib) as a function of the log of the collector current Ic is shown by the curve 100 in FIG. 2. The Beta is limited to a maximum value of less than 25 because of the limit on the width W of the base 18 in FIG. 1.

Appel et al., U.S. Pat. No. 6,030,864, disclose a method of making a vertical NPN transistor for use with CMOS logic technology having minimum feature sizes of 0.35 micrometers. The method uses a patterned photoresist to separate the bipolar transistor collector and emitter implants when fabricating the P- and N-channel FETs. After removing the photoresist, a silicon nitride blocking layer is used between the collector, emitter, and base contacts during implanting to compensate for the high peripheral base doping. Walker et al., U.S. Pat. No. 6,130,117, describe a method for making a BiCMOS in which the bipolar transistor is used as a silicon controlled rectifier (SCR) to control electrostatic discharges that can damage the FETs. Walker et al. do not address the separation of the emitter and base, or the width of the base for improved Beta. U.S. Pat. No. 6,174,760 B1 to Cheng et al. describes a vertical PNP bipolar transistor in which the P type substrate serves as the collector, an N well in the substrate forms the base, and then a P dopant is implanted in the N well to form the emitter.

However, there is still a strong need in the semiconductor industry to make circuits having bipolar junction transistors (BJTs) having high current gain (Beta) integrated with CMOS devices (FETs) while providing a simple semiconductor process that reduces manufacturing cost.

SUMMARY OF THE INVENTION

A principal object of this invention is to make a high current gain (Beta) bipolar junction transistor by making a thinner bipolar transistor base which is compatible with a CMOS process.

Another object of this invention is to achieve thinner base widths by utilizing portions of the patterned polysilicon layer, used to make the FET gate electrode structure, as a polysilicon gate mask to form novel bipolar structures. The patterned polysilicon portions used in the bipolar transistor serve only as implant masks to separate the base contacts from the emitters.

A further objective of this invention is to use this sequence of process steps to reduce process complexity and manufacturing costs.

In accordance with the objects of this invention, a method for making a novel bipolar transistor structure, which is compatible with CMOS processing, is achieved. This novel process provides a method for making bipolar transistors with thinner base widths, and therefore increased current gain, while requiring only one additional implant mask over the more conventional process. The method is described for making an NPN bipolar transistor. By reversing the dopant polarity, it is also possible to form a PNP bipolar transistor.

The method consists of providing a substrate. The substrate is preferably a single-crystal-silicon wafer having a <100> crystallographic orientation with respect to the substrate surface. A shallow trench isolation (STI) is formed in the substrate to electrically isolate and define device areas for the FETs and the bipolar transistors. Next the P wells and N wells for the respective CMOS N-channel and P-channel FETs are implanted. The P well implant also serves as the base of the NPN bipolar transistor. Then, a novel feature of this invention, is to use an implant mask to implant deep $N^+$ wells to make the subcollectors in the desired device areas for the NPN bipolar transistors.

More specifically, the bipolar transistor is formed from two adjacent device areas, called first and second device areas. First wells of an N type dopant are formed for the transistor collector contacts in the first device areas. Second wells of a P type dopant are formed in the second device areas adjacent to the first device areas for the transistor base regions, separated by the STI regions. N type doped third wells are deeply implanted under the first wells and the second wells and under the STI regions to form the transistor subcollectors. A gate oxide is formed on the substrate. Next, a key feature of the invention is to deposit and pattern a polysilicon layer to form gate electrode masking elements over the transistor base regions to isolate the base contact regions from the emitter regions. The polysilicon is also concurrently patterned to form CMOS FET gate electrodes elsewhere on the substrate. First lightly doped drains of an N type dopant are formed for N channel FETs and in the transistor emitter regions. Next, second lightly doped drains of a P type dopant are formed for P channel FETs and in the transistor base contact regions. Sidewall spacers are then formed on the gate electrodes and are also formed on the gate electrode masking elements over the transistor base regions. After forming the sidewall spacers, source/drain areas of an N type dopant are formed for the N channel FETs, and concurrently heavily doped source/drain implants are also used to form emitters in the transistor base regions. Then heavily doped P type source/drain areas are formed for the P channel FETs, and are also used to form heavily doped base contacts in the base contact regions to provide good low ohmic contact for the bipolar transistor. By the method of this invention, the gate electrode masking elements are used to separate the emitters from the base contact regions to maximize the emitter-to-base breakdown voltage. The bipolar CMOS devices are then completed using conventional processing. For example, a first insulating layer is deposited to protect and electrically insulate the devices. Then contact openings are etched, and a first metal is deposited and patterned to form a level of electrical interconnections.

BRIEF DESCRIPTION OF THE DRAWINGS

The objects and other advantages of the invention will become apparent in the preferred embodiment when read in conjunction with the following drawings.

DESCRIPTION OF THE PREFERRED EMBODIMENT

A method is now described for integrating novel bipolar junction transistors (BJTs) with CMOS structures. This novel bipolar transistor has improved current gain over the more conventional bipolar transistor and is integratable into the CMOS structure by using one additional masking and implant step over the more conventional process. The method is described for making a bipolar transistor, preferably an NPN transistor because of its electron mobility that results in higher switching speeds than a PNP transistor. However, it should be understood by those skilled in the art that by reversing the dopant polarity, it is also possible to form a PNP bipolar transistor integratable with a CMOS structure.

Figure 1:
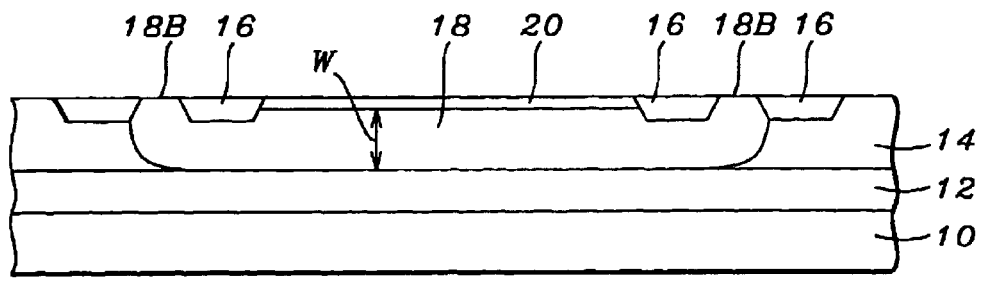
FIG. 1 shows a prior-art schematic cross-sectional view of a portion of a substrate having a bipolar transistor in which the shallow trench isolation is used to separate the emitter, base, and collector contacts.
Figure 2:
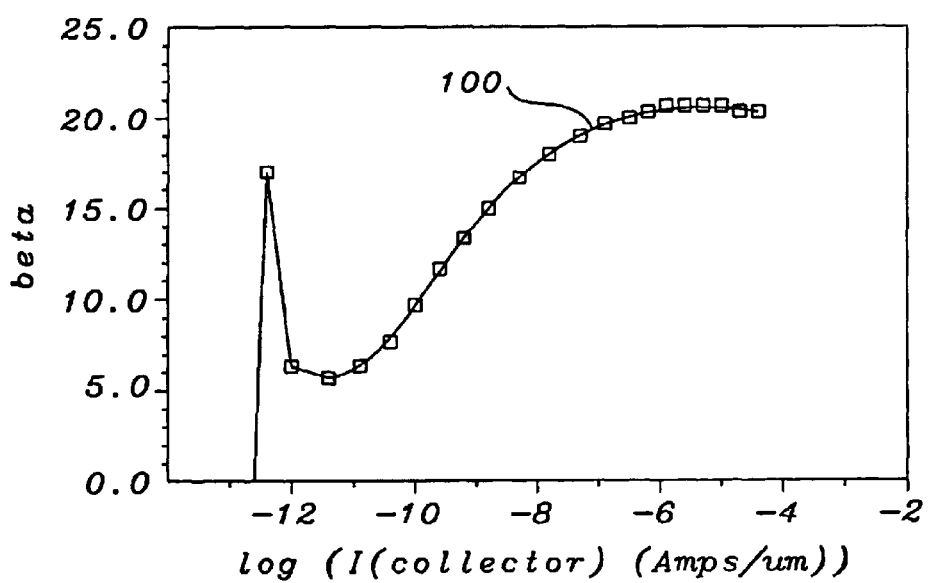
FIG. 2 shows a graph of the low current gain (Beta) as a function of the collector current for the prior-art bipolar transistor shown in FIG. 1.
Figure 3:
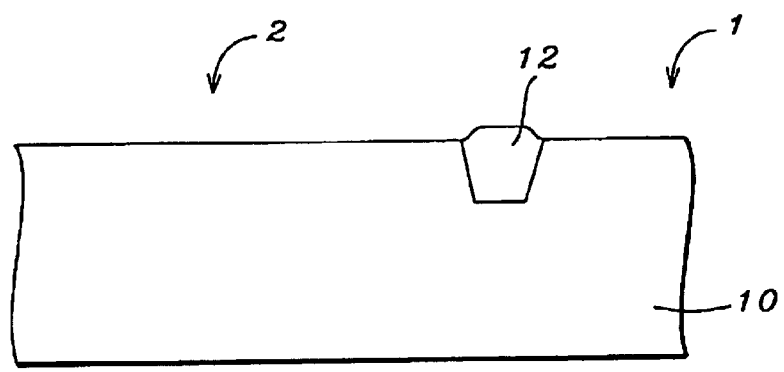
FIGS. 3 through 12 show schematic cross-sectional views of portions of a bipolar transistor. The drawings depict the sequence of process steps for integrating a bipolar transistor into a CMOS structure by the method of this invention.

Referring first to FIG. 3, the method begins by providing a substrate 10. The preferred substrate is a single-crystal silicon wafer having a <100> crystallographic orientation with respect to the substrate surface, and is P doped with boron (B). Shallow trench isolation (STI) regions 12 are formed in the substrate 10 to electrically isolate and define device areas for the bipolar transistors, and device areas for the FETs. The bipolar transistors are fabricated in adjacent device areas 1 and 2, while FETs are formed elsewhere on the substrate (not labeled). The STI regions 12 can be made by conventional means. For example, a photoresist mask and plasma etching are used to etch shallow trenches to a depth of about 3000 to 4500 Angstroms, and the trenches are filled with silicon oxide ($SiO_x$) and are planarized by polishing or by etching back. The bipolar transistor devices utilize a first device area having N wells, and an adjacent second device area having P wells. Only a portion of the bipolar structure is depicted in the FIGS. to simplify the drawings.

Figure 4:
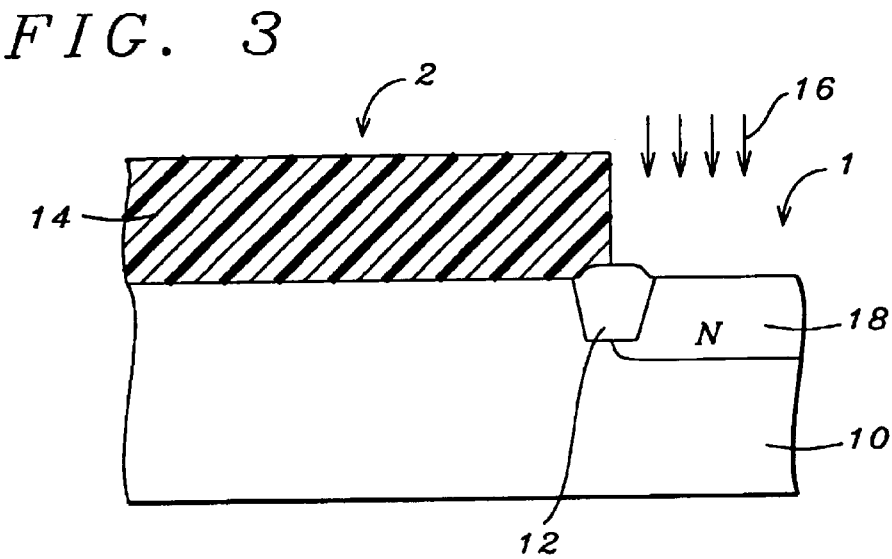

Referring to FIG. 4, a first photoresist mask 14 and an ion implant are utilized to form N wells 18 in the first device areas 1. The preferred implant is phosphorus and is implanted, as shown by the vertical arrows 16, to have a final concentration of between about 1.0 E 17 and 1.0 E 18 atoms/$cm^3$. The N wells 18 are formed to a depth of between about 6000 and 18000 Angstroms. The N wells 18 will serve as the reachthrough and the contact for the subcollector of the bipolar transistor. Then the first photoresist 14 is removed.

Figure 5:
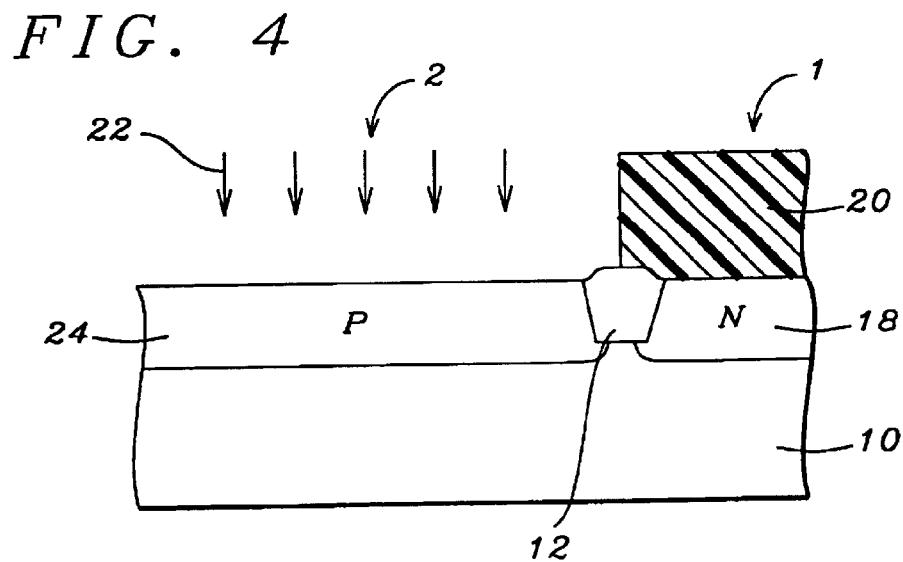

Referring to FIG. 5, P wells 24 are formed in the second device areas 2 similar to the method of forming the N wells. A second photoresist mask 20 is used to protect the first device areas 1. Then a P type dopant, such as boron, is implanted, as depicted by the vertical arrows 22, in the second device areas 2. The P well implant also serves as the base of the NPN bipolar transistor. The final dopant concentration of the P wells is between about 1.0 E 17 and 1.0 E 18 atoms/$cm^3$, and the P wells 24 are formed to a depth of between about 6000 and 18000 Angstroms. The second photoresist 20 is then removed.

Figure 6:
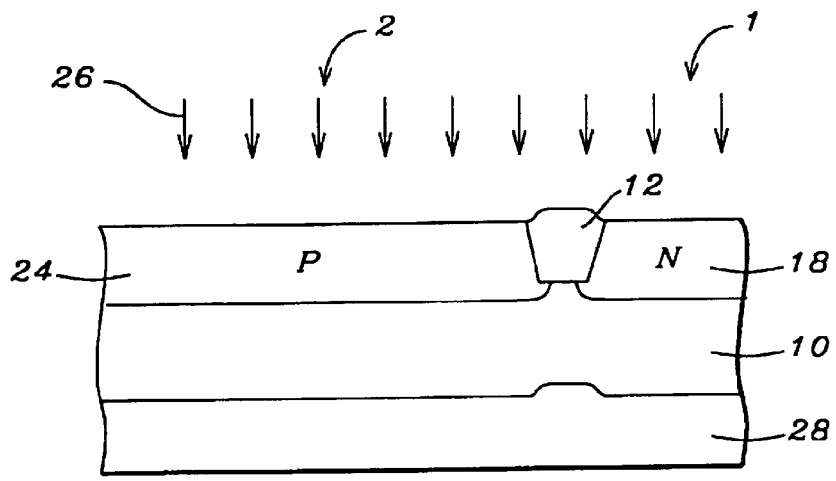

Referring now to FIG. 6, a novel feature of this invention is to form deep N wells 28 for subcollectors in the bipolar transistor device areas. The deep N wells are formed using an ion implant mask to protect other areas of the substrate, and by implanting an N type dopant, as indicated by the vertical arrows 26. The preferred N dopant is phosphorus and is implanted under the first wells 18 and second wells 24 and under the STI regions 12. The deep N wells 28 are formed to a median depth of between about 6000 and 20000 Angstroms, and to a maximum dopant concentration of between about 5.0 E 17 and 1.0 E 19 atoms/$cm^3$.

Figure 7A:
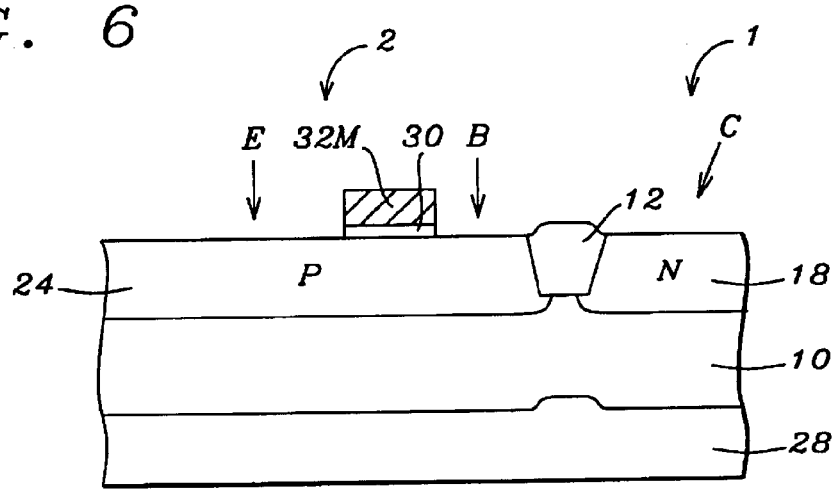
Figure 7B:
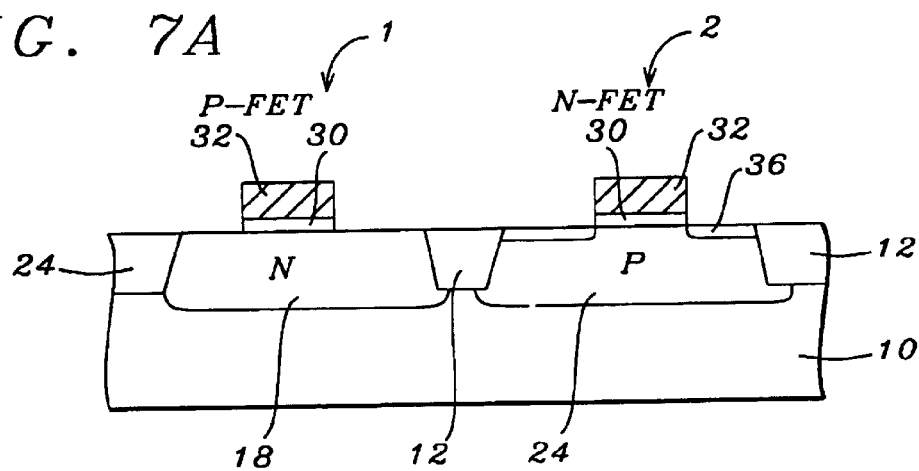

Referring to FIG. 7A, a gate oxide 30 is formed on the substrate. The gate oxide 30 is typically formed by thermal oxidation to a thickness of between about 20 and 50 Angstroms. Next a polysilicon layer 32 is deposited to a thickness of about 1500 to 2800 Angstroms, and is patterned to form the gate electrodes 32 for the P- and N-channel FETs, as shown in FIG. 7B. A key feature of this invention is to concurrently pattern the polysilicon layer 32 to form gate electrode masking elements 32M over the P wells 24, which also serve as transistor base regions 24. The masking elements 32M provide separation between the base contact regions B and the emitter regions E to increase the breakdown voltage between emitter and base, as shown in FIG. 7A.

Figure 8A:
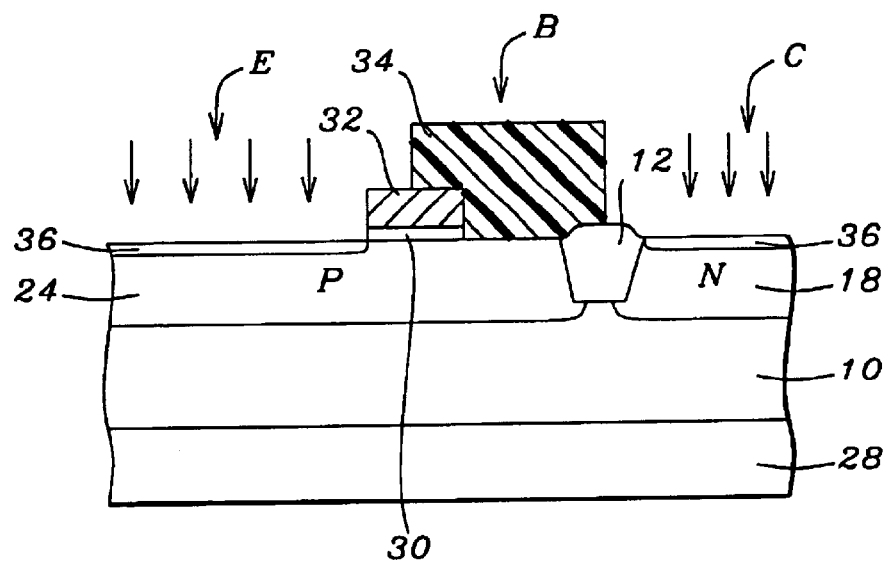
Figure 8B:
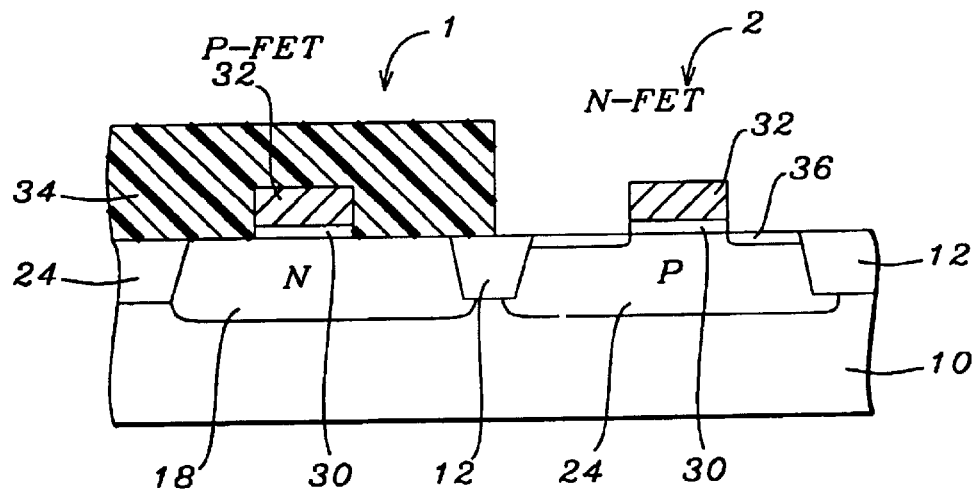

Referring next to FIGS. 8A and 8B, N doped first lightly doped drains 36 are formed in the P wells 24 for the N-channel FETs, as shown in FIG. 8B. Concurrently N doped first lightly doped drains 36 are also formed in the emitter regions E and in the collector contact regions C, as shown in FIG. 8A. The lightly doped drains 36 are formed by ion implantation using a photoresist blockout mask 34 to protect other areas of the substrate from the implants.

Preferably the first lightly doped drains 36 are formed to a depth of between about 800 and 1500 Angstroms, and by implanting arsenic to a final concentration of between about 1.0 E 18 and 1.0 E 19 atoms/cm$^3$.

Figure 9A:
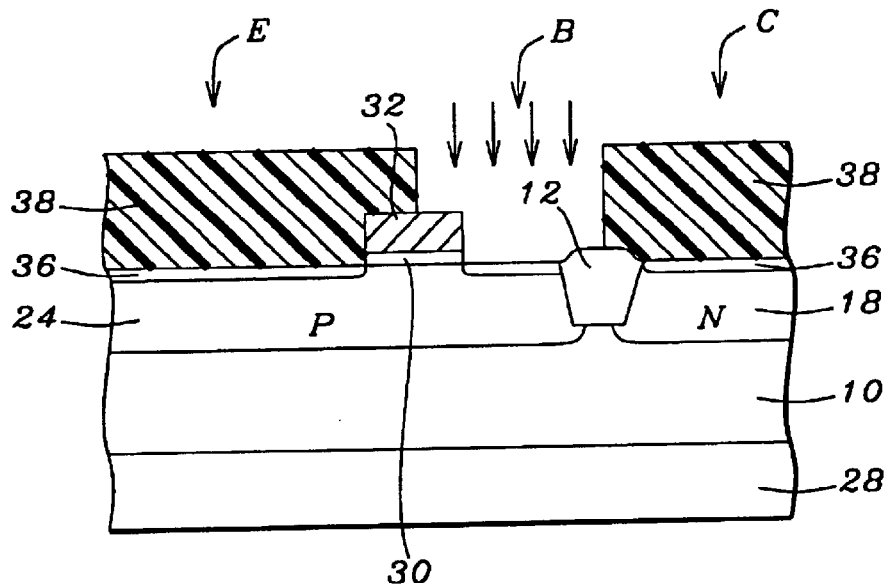
Figure 9B:
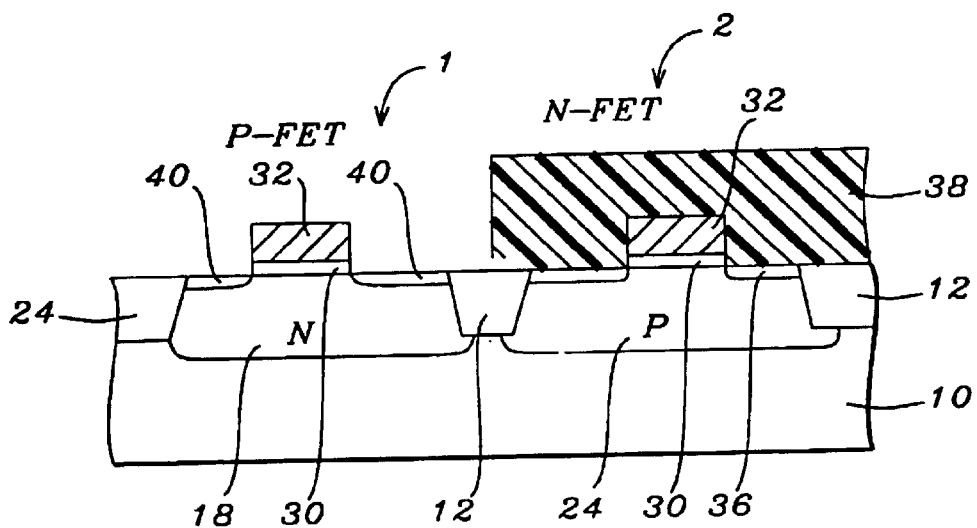

Referring to FIGS. 9A and 9B, P doped second lightly doped drains 40 are formed in the N wells 18 for the P-channel FETs, as shown in FIG. 9B. Concurrently P doped second lightly doped drains 40 are also formed in the base contact regions B, as shown in FIG. 9A. The lightly doped drains 40 are formed by ion implantation using a photoresist blockout mask 38 to protect other areas of the substrate from the implants, which includes the emitter areas E and the collector areas C of the bipolar transistor. The second lightly doped drains 40 are formed to a preferred depth of between about 800 and 1500 Angstroms, and by implanting boron to achieve a final concentration of between about 1.0 E 18 and 1.0 E 19 atoms/cm$^3$.

Figure 10A:
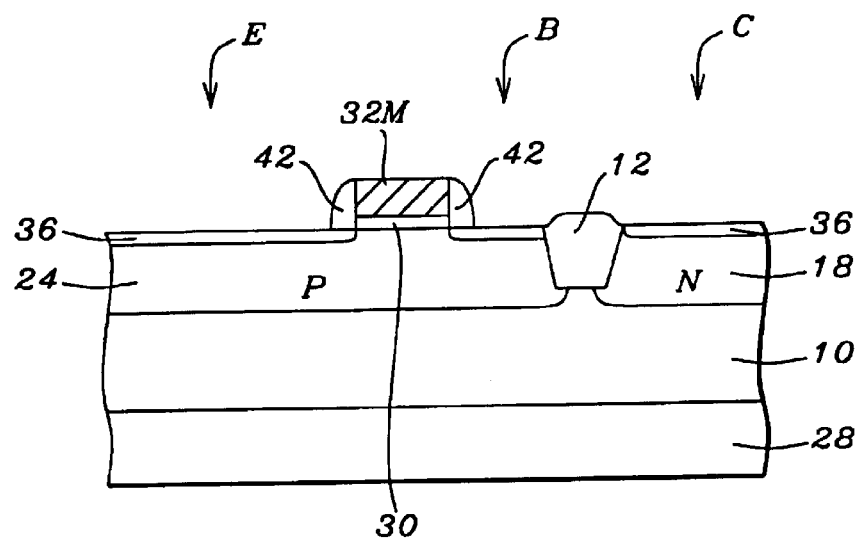
Figure 10B:
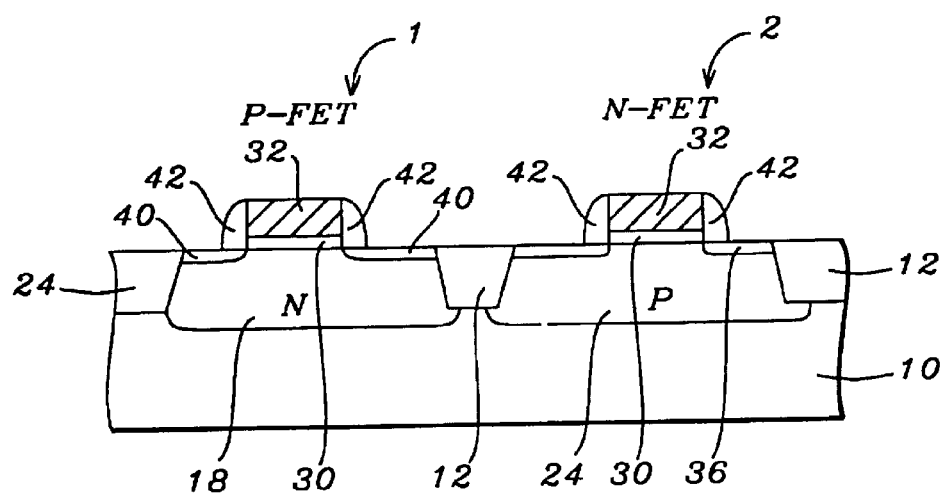

Referring to FIGS. 10A and 10B, sidewall spacers 42 are then formed on the gate electrodes 32, as shown in FIG. 10B, and are also formed on the gate electrode masking elements 32M over the transistor base regions formed from the P wells 24, as shown in FIG. 10A. The sidewall spacers 42 are formed by depositing a conformal insulating layer, such as SiO$_x$ and/or silicon nitride, and anisotropically plasma etching back to the substrate.

Figure 11A:
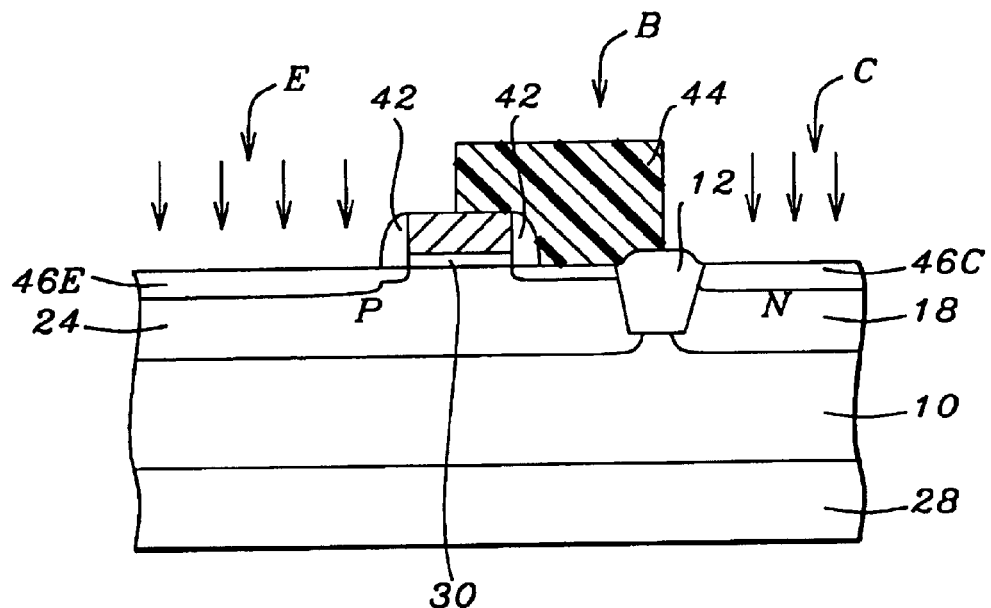
Figure 11B:
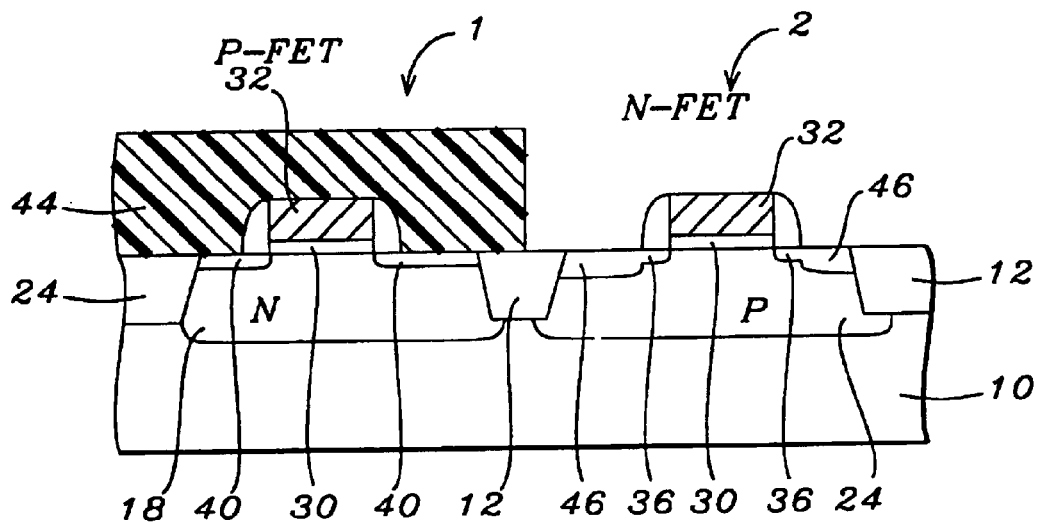

Referring to FIGS. 11A and 11B, next, heavily doped source/drain areas 46 of an N type dopant are formed for the N channel FETs, as shown in FIG. 11B. Concurrently heavily doped source/drain implants are used to form emitters 46E in the transistor base regions 24 and also to form heavily doped collector contact areas 46C to provide better ohmic contacts to the collector reachthrough region 18, as shown in FIG. 11A. A photoresist blockout mask 44 is used to protect other areas of the substrate from the ion implant. Preferably the heavily doped source/drain areas 46 are formed to a depth of between about 1100 and 2500 Angstroms, and by implanting arsenic to a final concentration of between about 1.0 E 20 and 8.0 E 20 atoms/cm$^3$.

Figure 12A:
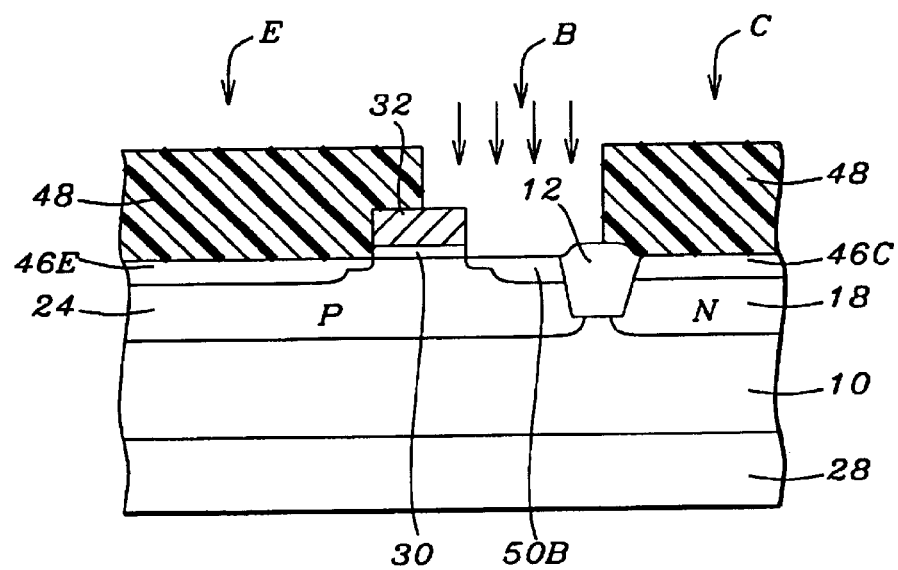
Figure 12B:
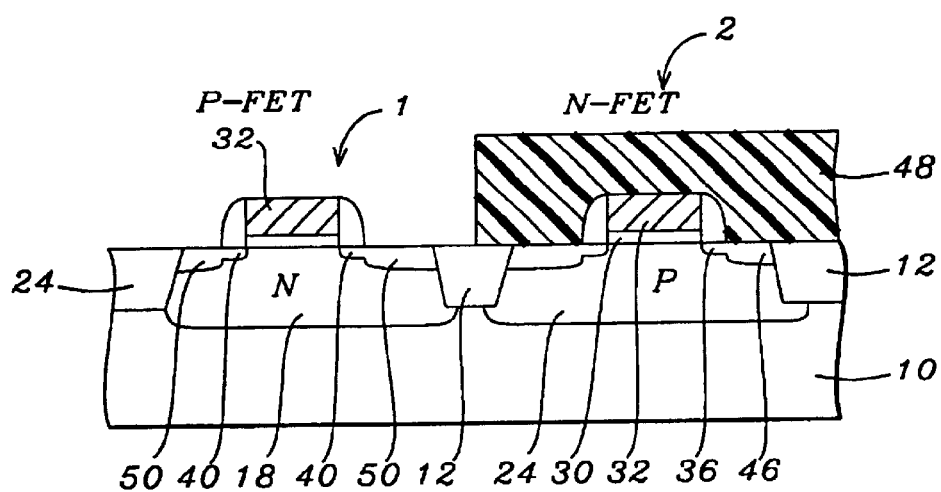

Referring to FIGS. 12A and 12B, next, heavily doped source/drain areas 50 of a P type dopant are formed for the P-channel FETs, as shown in FIG. 12B. Concurrently heavily doped source/drain implants are used to form heavily doped base contact areas SOB, as shown in FIG. 12A. A photoresist blockout mask 48 is used to protect other areas of the substrate from the ion implant. Preferably the heavily doped source/drain areas 50 are formed to a depth of between about 1100 and 2500 Angstroms, and by implanting boron to a final concentration of between about 1.0 E 20 and 8.0 E 20 atoms/cm$^3$.

Figure 13:
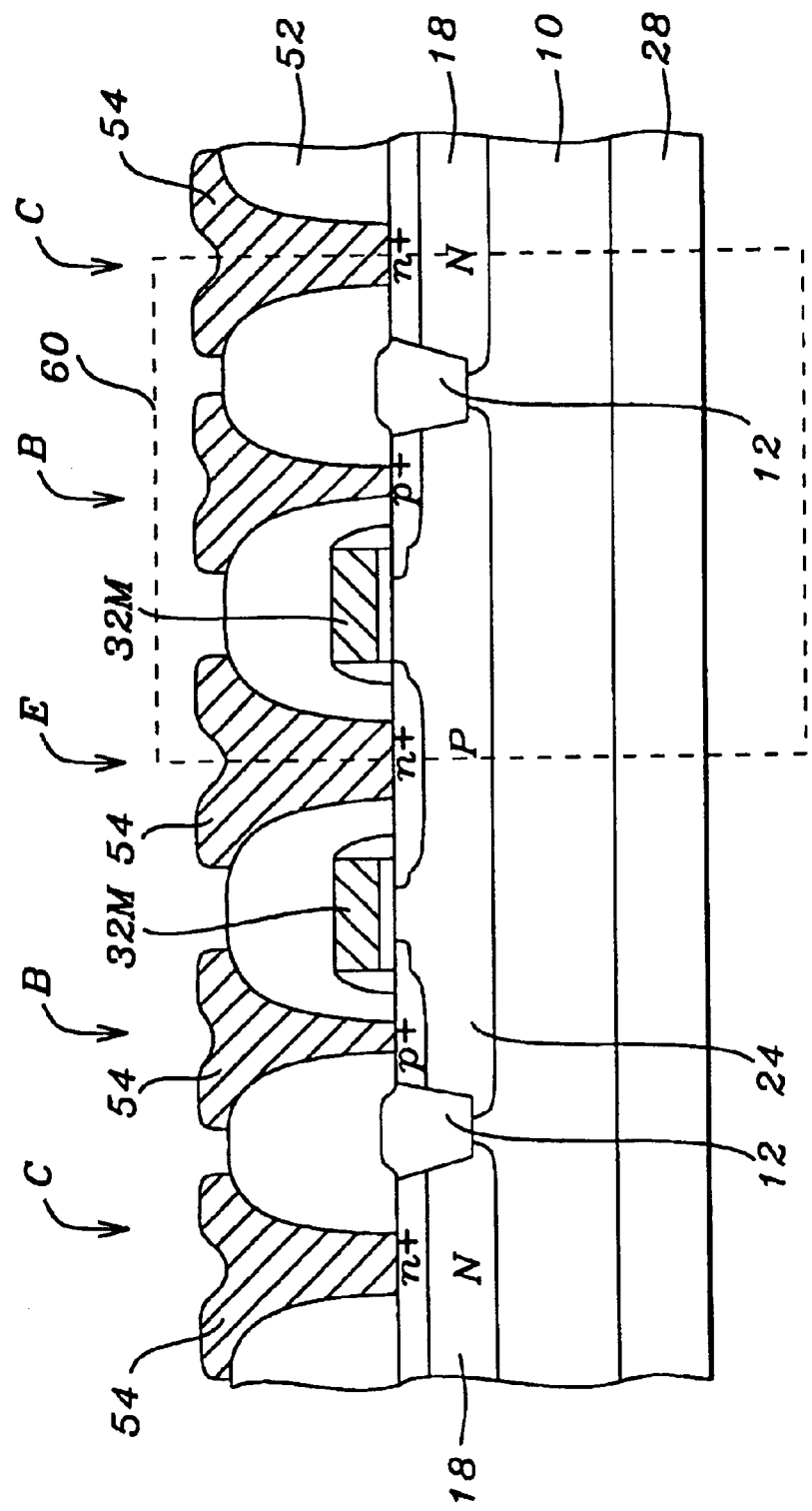
FIG. 13 shows a schematic cross-sectional view of a full completed bipolar transistor formed by the method of this invention.

To better appreciate the invention, a full bipolar structure is shown in FIG. 13, completed up to the first level of metallization. The cross-sectional portion of the bipolar transistor formed in the sequence of steps in FIGS. 3 through 12 is depicted within the dashed lines 60 shown in FIG. 13. For example, a first insulating layer 52 is deposited to protect and electrically insulate the devices. Then contact openings are etched in the insulating layer 52 to the emitter E, to the base B, and the collector C, and a metal layer 54 is deposited and patterned to form a first level of electrical interconnections 54. The insulating layer 52 and the metal layer 54 are fabricated using conventional processing. The insulating layer 52 can be a conventional material such as silicon oxide, or a more advanced low-dielectric insulator. For example, the metal layer 54 can be aluminum or tungsten, that would include a barrier layer, or a more advanced metallurgy can be used, such as copper.

Figure 14:
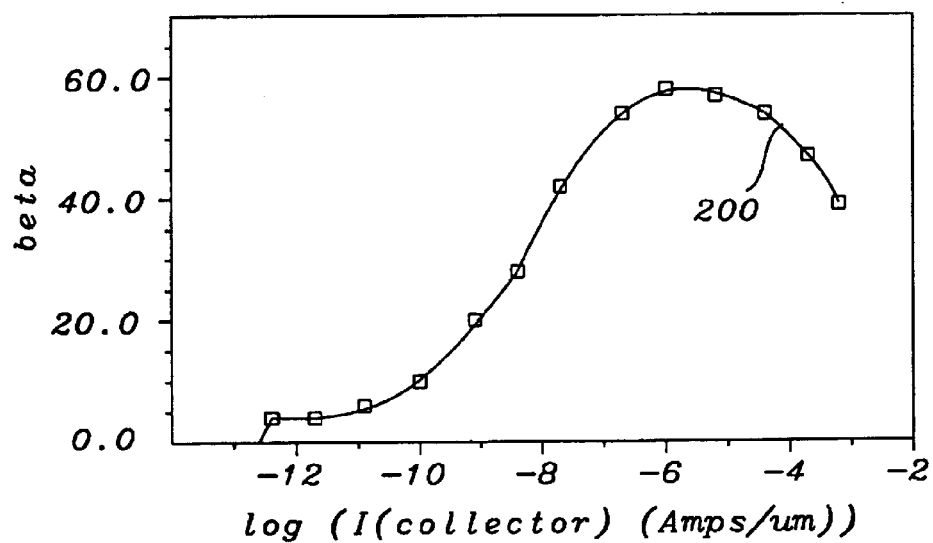
FIG. 14 shows a graph of the improved (higher) current gain (Beta) as a function of the collector current for the bipolar transistor of this invention.

In this improved bipolar transistor, the gate electrode masking elements 32M provide separation between the emitter E and base contacts B to maximize the emitter-to-base breakdown voltage. Since the P well 24 is used as the intrinsic base, also labeled 24, it is not necessary to implant through the STI 12. This results in a thinner base width and results in a higher Beta, as shown in the graph of FIG. 14. The higher current gain (Beta) (Ic/Ib) as a function of the log of the collector current Ic is shown by the curve 200 in FIG. 14 for this improved bipolar transistor. Because of the ability to form a narrower base width, the Beta is increased to a value of about 60, which is substantially higher than the more conventional bipolar having a nominal Beta of 25.

While the invention has been particularly shown and described with reference to the preferred embodiment thereof, it will be understood by those skilled in the art that various changes in form and details may be made without departing from the spirit and scope of the invention.

What is claimed is:

1. A bipolar junction transistor structure integratable with a CMOS structure comprised of:

a substrate having first and second device areas surrounded by trench isolation regions;

first wells of an N type dopant for transistor collector contacts in said first device areas;

second wells of a P type dopant in said second device areas adjacent to said first device, areas for transistor base regions;

third wells of said N type dopant under said first and second wells and under said trench isolation regions for transistor subcollectors;

gate electrode masking elements over said transistor base regions isolating transistor base contact regions from transistor emitter regions, while concurrently providing CMOS FET gate electrodes elsewhere on said substrate;

first lightly doped drains of said N type dopant for said CMOS FETs and in said transistor emitter regions;

second lightly doped drains of said P type dopant for said CMOS FETs and in said transistor base contact regions;

sidewall spacers on said gate electrodes and on said gate electrode masking elements;

source/drain areas of said N type dopant for said CMOS FETs, and concurrently providing emitters in said transistor emitter regions over and within said transistor base regions;

source/drain areas of said P type dopant for said CMOS FETs, and concurrently providing ohmic base contacts in said base contact regions, said emitters separated from said base contact regions by said gate electrode masking elements.

2. The structure of claim 1, wherein said substrate is a single-crystal silicon substrate.

3. The structure of claim 1, wherein said N type dopant is arsenic, and said P type dopant is boron.

4. The structure of claim 1, wherein said wells for said subcollectors have a final dopant concentration of between about 5.0 E 17 and 1.0 E 19 atoms/cm$^3$.

5. The structure of claim 1, wherein said base regions have a depth of between about 2000 and 10000 Angstroms from surface of said substrate.

6. The structure of claim 1, wherein said gate electrodes for said FETs and said gate electrode masking elements are formed from a patterned polysilicon layer and have a thickness of between about 1500 and 2800 Angstroms, and said patterned polysilicon layer has insulating sidewall spacers.

* * * * *